(12) United States Patent
Yoshida et al.

(10) Patent No.: US 7,157,752 B2
(45) Date of Patent: Jan. 2, 2007

(54) SEMICONDUCTOR DEVICE

(75) Inventors: Jun Yoshida, Kawasaki (JP); Yutaka Takinomi, Kawasaki (JP); Hiroyuki Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 40 days.

(21) Appl. No.: 10/811,488

(22) Filed: Mar. 29, 2004

(65) Prior Publication Data

US 2005/0093051 A1 May 5, 2005

(30) Foreign Application Priority Data

Oct. 29, 2003 (JP) .............................. 2003-368242

(51) Int. Cl.
*H01L 27/10* (2006.01)
(52) U.S. Cl. .................. 257/211; 257/207; 257/758
(58) Field of Classification Search ................ 257/758, 257/691, 506, 202–211, 303, 296, 300
See application file for complete search history.

(56) References Cited

U.S. PATENT DOCUMENTS 5,949,098 A 9/1999 Mori
6,339,234 B1 * 1/2002 Takizawa .................... 257/203

* cited by examiner

*Primary Examiner*—Hoai Pham
*Assistant Examiner*—Dilinh Nguyen
(74) *Attorney, Agent, or Firm*—Arent Fox PLLC

(57) ABSTRACT

A semiconductor device capable of effectively eliminating noise on multilayered power lines with a bypass capacitor. A first power line is connected to the bypass capacitor. A second power line is a line from which a part located above the bypass capacitor is removed. Contacts connect the first and second power lines. Therefore, noise appearing on the second power line travels to the first power line, resulting in effectively eliminating the noise with the bypass capacitor.

8 Claims, 4 Drawing Sheets

SEMICONDUCTOR DEVICE

CROSS-REFERENCE TO RELATED APPLICATIONS

This application is based upon and claims the benefit of priority from the prior Japanese Patent Application No. 2003-368242, filed on Oct. 29, 2003, the entire contents of which are incorporated herein by reference.

BACKGROUND OF THE INVENTION (1) Field of the Invention

This invention relates to a semiconductor device, and more particularly, to a semiconductor device capable of reducing noise on power lines with a bypass capacitor.

(2) Description of the Related Art

Some semiconductor devices contain bypass capacitors to avoid malfunctions of the internal circuits caused by instability of power sources and high-frequency noise on power lines. For such a bypass capacitor, first and second wiring layers which are multilayered are provided. The first and second wiring layers are used for first and second power lines, respectively. One of these lines is placed on the other, thereby creating a capacitance. As a result, the bypass capacitor is formed in the semiconductor device (for example, refer to columns [0019]–[0022] and FIG. 1 in Japanese Patent Laid Open No. 9-64284).

To avoid common mode noise on a digital multilayer board, a bypass capacitor is inserted between a circuit and a power source. High frequency current necessary for circuit switching is supplied through power lines in wiring layers. Therefore, if a bypass capacitor is not installed, voltage varies due to inductance between a power line and a circuit, resulting in generating pulse noise. To minimize the inductance as much as possible, a bypass capacitor is installed close to the circuit. That is, by temporarily accumulating direct current in the bypass capacitor, necessary high frequency current is supplied to the circuit stability. This suppresses the variation of the power source current which causes high frequency noise, resulting in reducing the common mode noise on the digital multilayer board.

FIG. 3 is a cross-sectional view of a conventional semiconductor device.

As shown in FIG. 3, in the semiconductor device, two-layered power lines 103a and 103b being connected to each other via a contact 102 and two-layered power lines 105a and 105b being connected to each other via a contact 104 are arranged above a bypass capacitor 101. In addition, a NAND gate 106 is arranged above the power lines 103a and 105a.

The bypass capacitor 101 is composed of a MOS transistor. The bypass capacitor 101 is composed of a P-type semiconductor substrate 101a, two N-type regions 101b and 101c formed on the substrate 101a, and a gate electrode 101d on the N-type regions 101b and 101c with a gate insulating film inserted therebetween. The gate electrode 101d and one of the N-type regions 101b and 101c serve as the terminals of the bypass capacitor 101.

The power lines 103a and 103b being connected to each other with the contact 102 are connected to one electrode of the power source. The lower-layered power line 103b is connected to the N-type region 101b of the bypass capacitor 101. The power lines 105a and 105b being connected to each other with the contact 104 are connected to the other electrode of the power source. The lower-layered power line 105b is connected to the gate electrode 101d of the bypass capacitor 101.

The NAND gate 106 operates by receiving power through the power lines 103a and 105a. The bypass capacitor 101 is installed close to the NAND gate 106 so as to effectively eliminate noise on the power lines 103a, 103b, 105a, and 105b.

FIG. 4 is a plan view of another conventional semiconductor device.

As shown in FIG. 4, a semiconductor tip 112 is provided in a package 111. Arranged on the semiconductor tip 112 are bypass capacitors 113a and 113b, I/O cells 114a and 114b, power lines 115a and 115b, and pads 116a and 116b. Leads 117a and 117b are provided in the package 111. The pads 116a and 116b and the leads 117a and 117b are connected to each other with wires 118a and 118b by bonding.

The power lines have a two-layer wiring structure. FIG. 4 shows only upper-layered power lines 115a and 115b (lower-layered power lines are hidden by the upper-layered power lines 115a and 115b). The I/O cells 114a and 114b are connected to the lower-layered power lines to receive power.

Signals from the I/O cells 114a and 114b are output to the leads 117a and 117b through the pads 116a and 116b and the wires 118a and 118b. Signals entered into the leads 117a and 117b are input to the I/O cells 114a and 114b through the wires 118a and 118b and the pads 116a and 116b.

The I/O cells 114a and 114b receive power through the power lines 115a and 115b to amplify signals. The bypass capacitors 113a and 113b are installed close the I/O cells 114a and 114b so as to effectively eliminate noise on the power lines 115a and 115b.

SUMMARY OF THE INVENTION

There provided a semiconductor device having a multilayer wiring structure. In this semiconductor device, a first power line being connected to a bypass capacitor, a second power line from which a part corresponding to a position of the bypass capacitor is removed, and contacts connecting the first power line and the second power line.

The above and other features and advantages of the present invention will becomes apparent from the following description when taken in conjunction with the accompanying drawings which illustrate preferred embodiments of the present invention by way of example.

DESCRIPTION OF THE PREFERRED EMBODIMENTS

Impedance of a power line being connected with a bypass capacitor is higher for a contact than that of a power line which is not connected to the bypass capacitor. Therefore, in the multilayer wiring structure, when noise appears on a power line which is not connected to a bypass capacitor, the noise travels on this power line and is not eliminated with the bypass capacitor effectively.

In view of the foregoing objects, this invention intends to provide a semiconductor device capable of effectively eliminating noise with a bypass capacitor.

Hereinafter, preferred embodiments of this invention will be described in detail with reference to attached drawings.

Figure 1:
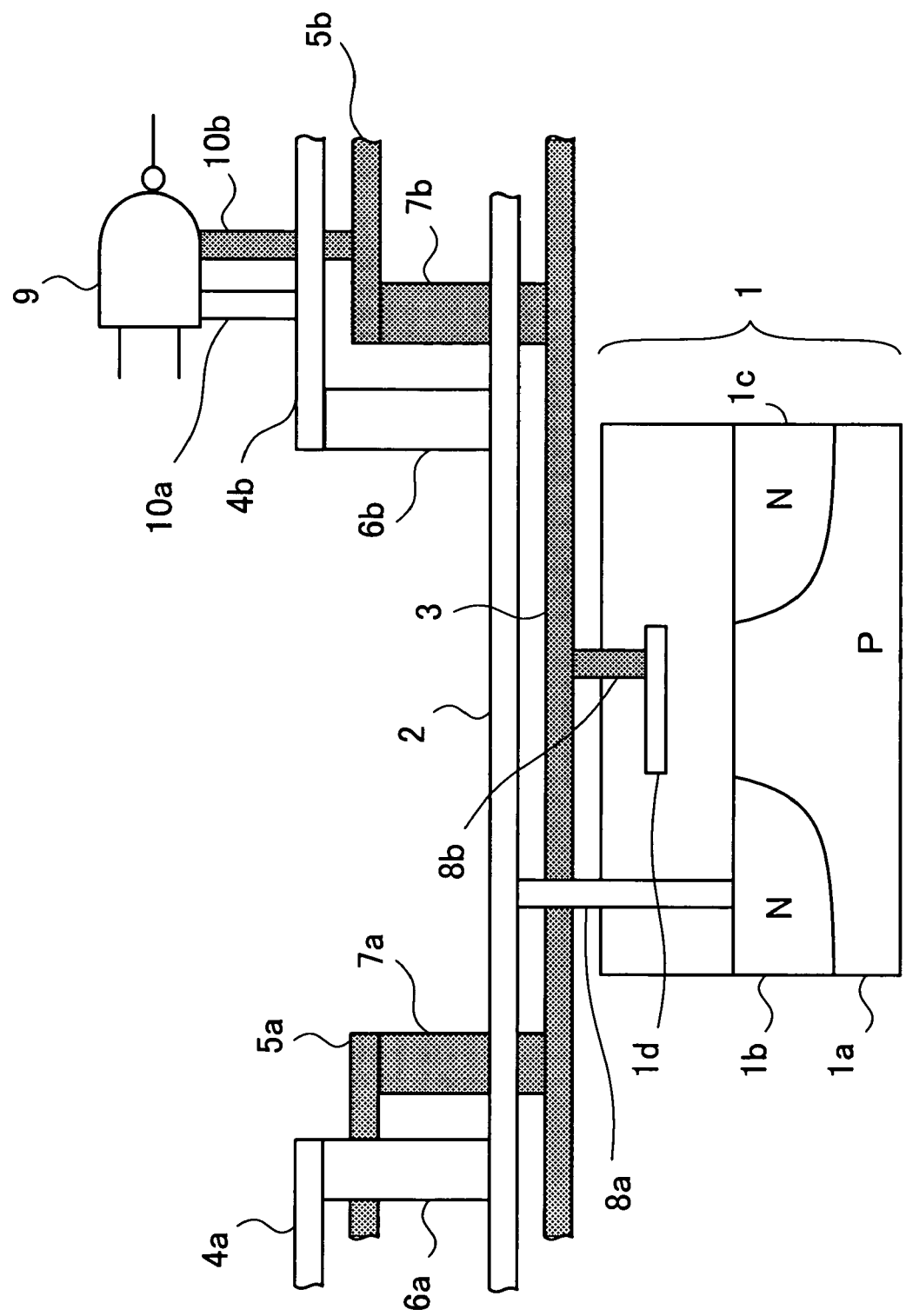
FIG. 1 is a cross sectional view of a semiconductor device according to a first embodiment.

FIG. 1 is a cross sectional view of a semiconductor device according to a first embodiment.

As shown in FIG. 1, this semiconductor device is composed of a bypass capacitor 1, power lines 2, 3, 4a, 4b, 5a, and 5b, contacts 6a, 6b, 7a, 7b, 8a, 8b, 10a, and 10b, and a NAND gate 9.

The bypass capacitor 1 is composed of a MOS transistor. This capacitor 1 is composed of a P-type semiconductor substrate 1a, N-type source and drain regions 1b and 1c on the semiconductor substrate 1a, and a gate electrode 1d on the two N-type regions 1b and 1c with a gate insulating film inserted therebetween. The N-type region 1b and the gate electrode 1d serve as the terminals of the bypass capacitor 1.

The power lines 2, 3, 4a, 4b, 5a, and 5b are installed above the bypass capacitor 1. One electrode of the power source, for example, positive voltage is applied to the power lines 2, 4a, and 4b. The other electrode of the power source, for example, negative voltage is applied to the power lines 3, 5a, and 5b.

The power lines 2, 3, 4a, 4b, 5a, and 5b have a multilayer wiring structure. Out of the positive lines, the power line 2 is a lower-layered line while the power lines 4a and 4b are upper-layered lines. In the upper-layered power lines 4a and 4b, a part located above the bypass capacitor 1 is removed. Out of the negative lines, the power line 3 is a lower-layered line while the power lines 5a, 5b are upper-layered lines. In the upper-layered power lines 5a and 5b, a part located above the bypass capacitor 1 is removed.

The contacts 6a and 6b are attached to the ends of the power lines 4a and 4b between which the line is removed (between which the capacitor 1 exists thereunder). The contacts 6a and 6b connect the power lines 4a and 4b and the power line 2. The contacts 7a and 7b are attached to the ends of the power lines 5a and 5b between which the line is removed. The contacts 7a and 7b connect the power lines 5a and 5b and the power line 3.

The contacts 6a, 6b, 7a, and 7b are made wider than the power lines 2 and 3. For example, assume that each power line 2, 3 has a width of 10 μm, each contact 6a, 6b, 7a, 7b is made to have a width of 30 μm. Recently, wires including power lines have a tendency to be made thinner. However, the contacts 6a, 6b, 7a and 7b wider than the power lines 4a, 4b, 5a and 5b prevent impedance from decreasing in the contacts 6a, 6b, 7a, and 7b. Therefore, noise naturally travels to the lower-layered power lines 2 and 3 being connected to the bypass capacitor 1, resulting in effectively eliminating the noise.

The contact 8a connects the power line 2 and the N-type region 1b of the bypass capacitor 1. The contact 8b connects the power line 3 and the gate electrode 1d of the bypass capacitor 1. Thereby the positive power line 2 and the negative power line 3 are connected to the bypass capacitor 1.

The NAND gate 9 is connected to the power lines 4b and 5b with the contacts 10a and 10b. Thereby the gate 9 is supplied with power. To effectively eliminate instability of the power source and high frequency noise on the power lines 2, 3, 4a, 4b, 5a and 5b, the bypass capacitor 1 is installed close to the NAND gate 9. Note that use of the NAND gate 9 is just an example for using the bypass capacitor. Alternatively, the bypass capacitor 1 may be placed close to the core circuit of a CPU.

As described above, in the power lines 4a, 4b, 5a, and 5b which are not connected to the bypass capacitor 1, the lines located above the bypass capacitor 1 are removed. Then these power lines are connected with the contacts 6a, 6b, 7a, and 7b to the power lines 2 and 3 being connected to the bypass capacitor 1. As a result, noise on the power lines 4a, 4b, 5a, and 5b which are not connected to the bypass capacitor 1 travels to the power lines 2 and 3 being connected to the bypass capacitor 1, resulting in effectively eliminating the noise with the bypass capacitor 1.

In addition, effective elimination of noise avoids malfunctions of the circuits.

Further, the contacts 6a, 6b, 7a and 7b connect the ends of the power lines 4a, 4b, 5a, and 5b, between which the lines are removed, and the lower-layered power lines 2 and 3. This is capable of avoiding noise from traveling to points away from the bypass capacitor 1 on the power lines 2 and 3.

It should be noted that a plurality of contacts 6a, 6b, 7a and 7b can be installed. For example, two contacts can be used to connect the power lines 4a and 2, the power lines 4b and 2, the power lines 5a and 3, or the power lines 5b and 3. By doing so, impedance from the upper-layered power line 4a, 5a, 5b to the lower-layered power line 2, 3 is reduced.

Still further, although FIG. 1 shows the power lines 2, 3, 4a, 4b, 5a and 5b located above the bypass capacitor 1, these lines can be installed under the capacitor 1. In addition, parts located above the bypass capacitor 1 can be removed from the lower-layered power lines 2 and 3, instead of the upper-layered power lines 4a, 4b, 5a and 5b. In this case, the bypass capacitor 1 should be connected to the upper-layered power lines 4a, 4b, 5a, and 5b.

Next, a semiconductor device according to the second embodiment will be described with reference to a figure.

Figure 2:
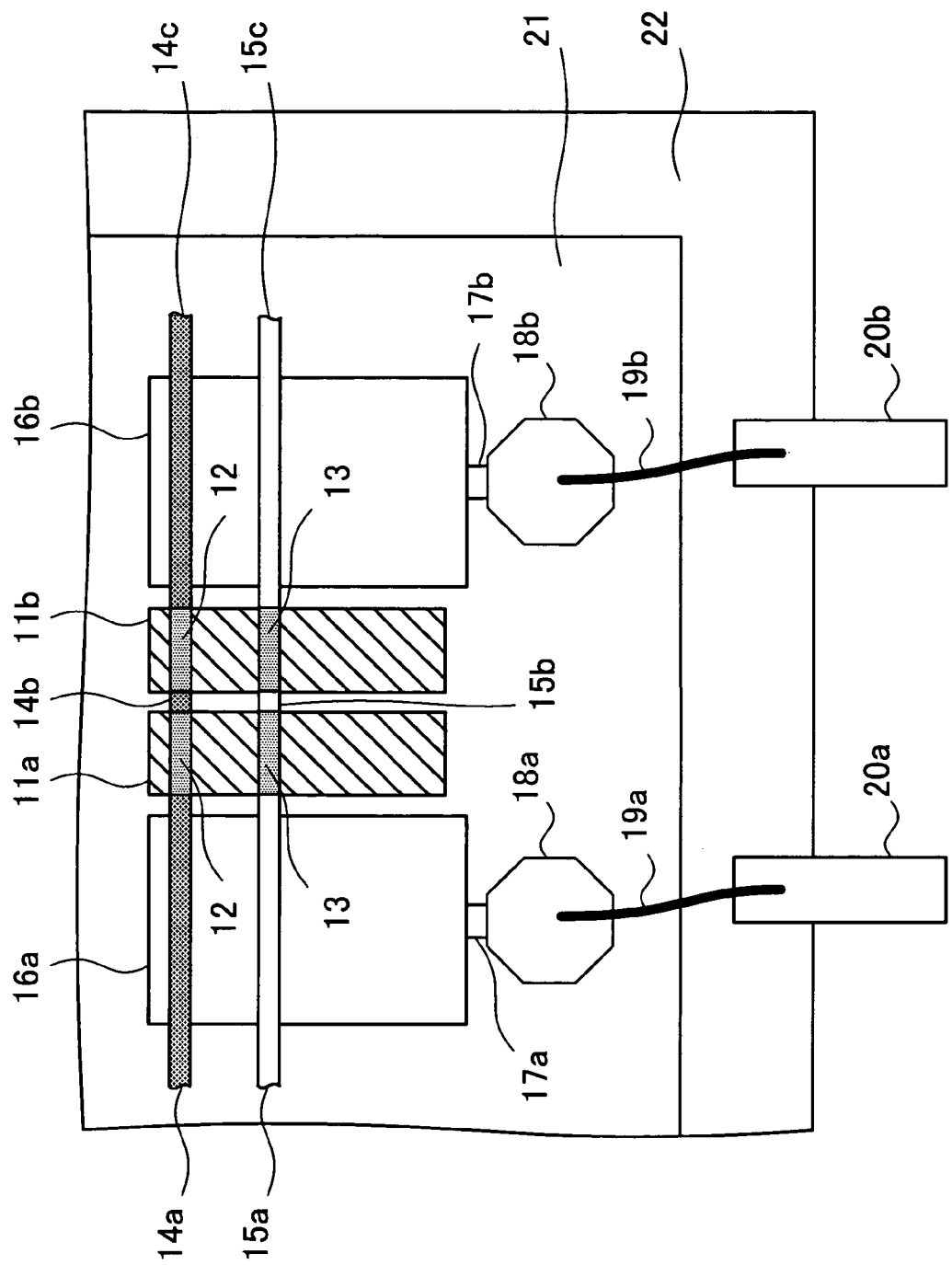
FIG. 2 is a plan view of a semiconductor device according to a second embodiment.
Figure 3:
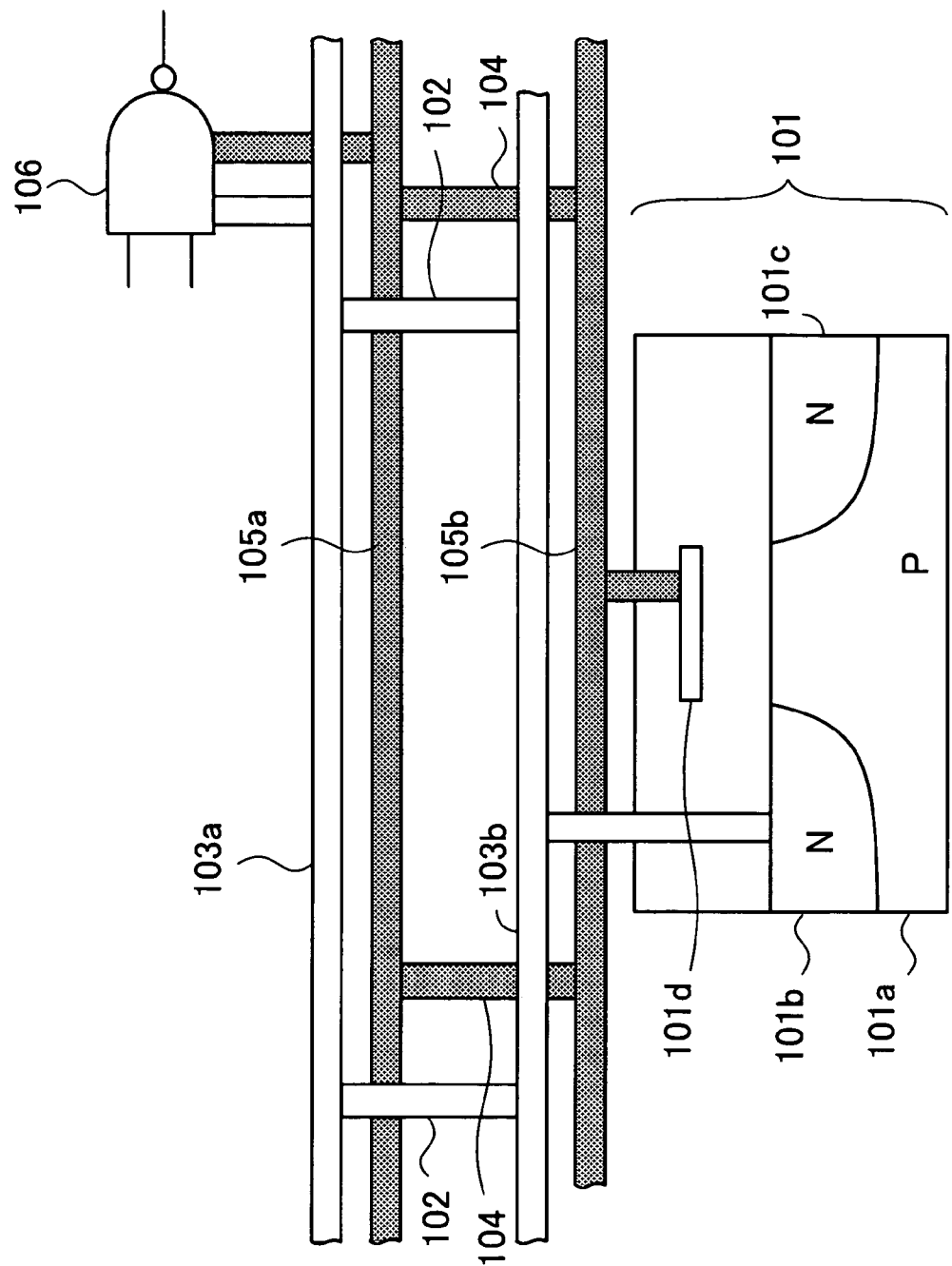
FIG. 3 is a cross sectional view of a conventional semiconductor device.
Figure 4:
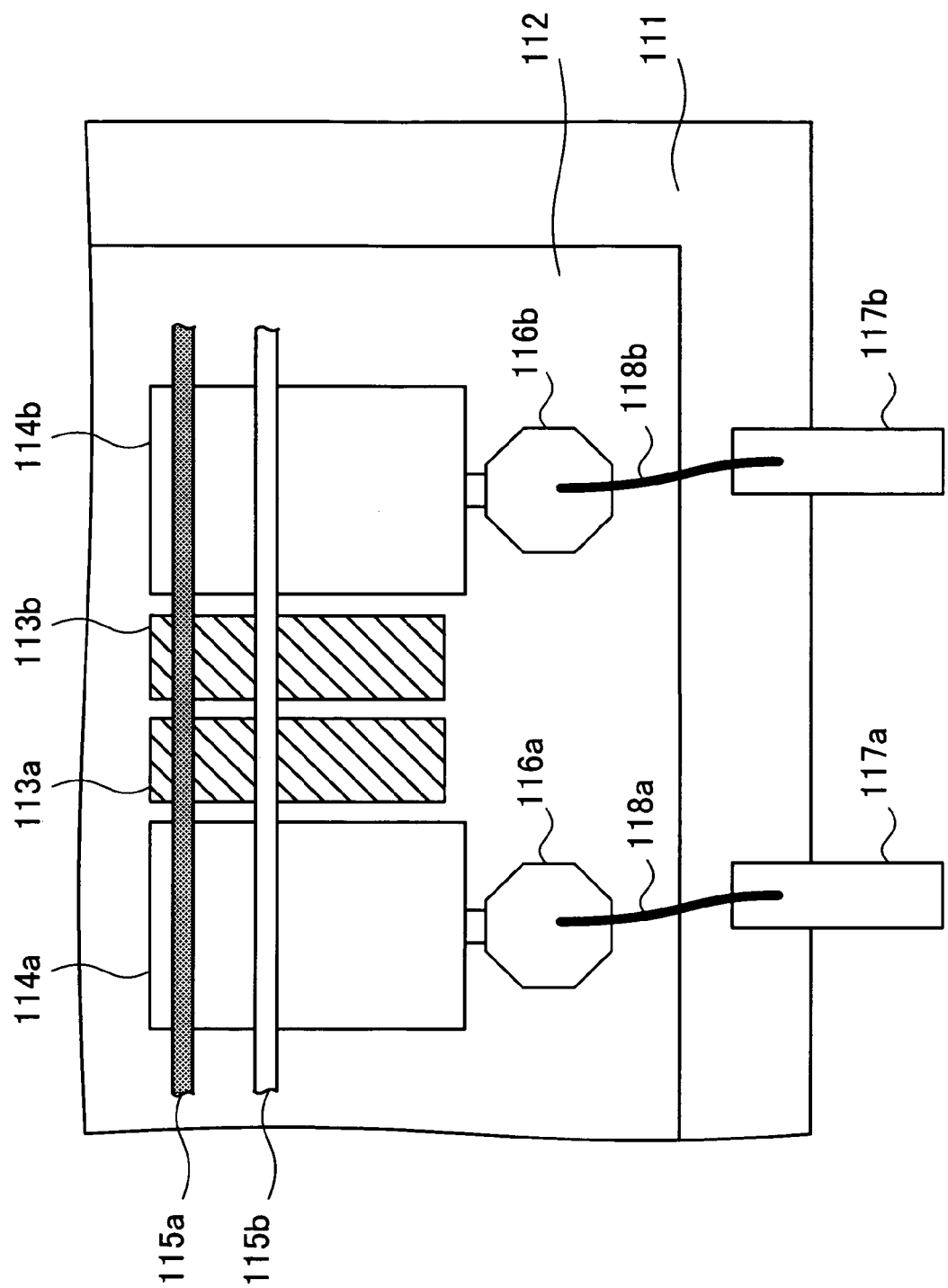
FIG. 4 is a plan view of another conventional semiconductor device.

FIG. 2 is a plan view of the semiconductor device according to the second embodiment.

As shown in FIG. 2, a semiconductor tip 21 is installed in a package 22. Arranged on the semiconductor tip 21 are bypass capacitors 11a and 11b, power lines 12, 13, 14a to 14c, and 15a to 15c, I/O cells 16a and 16b, lines 17a and 17b, and pads 18a and 18b. The package 22 is provided with leads 20a and 20b which are connected with lines on a circuit board when the semiconductor device is mounted on the board. The pads 18a and 18b and leads 20a and 20b are connected to each other with wires 19a and 19b by bonding.

The I/O cells 16a and 16b are buffers arranged around the semiconductor tip 21 to amplify signals to be input/output in/from the semiconductor tip 21. The I/O cells 16a and 16b are connected to the pads 18a and 18b with the wires 17a and 17b. Therefore, signals from the I/O cells 16a and 16b are output to the leads 20a and 20b through the pads 18a and 18b and the wires 19a and 19b. Signals entered from the outside to the leads 20a and 20b are input to the I/O cells 16a and 16b through the wires 19a and 19b and the pads 18a and 18b.

The power lines 12 and 13 are installed above the bypass capacitors 11a and 11b and the I/O cells 16a and 16b. The power lines 12 and 13 are connected to the bypass capacitor 11a and 11b with contacts. Installed above the power lines 12 and 13 are the power lines 14a to 14c, and 15a to 15c in which parts located above the bypass capacitors 11a and 11b are removed. As shown in FIG. 2, the lower-layered power lines 12 and 13 above the bypass capacitors 11a and 11b can be seen from above while they can not because they are located under the power lines 14a to 14c, 15a to 15c.

The ends of the upper-layered power lines 14a to 14c, and 15a to 15c, between which the lines do not exist, are connected to the lower-layered power lines 12 and 13 with contacts. One electrode of the power source, for example, positive voltage is applied to the power lines 12, 14a to 14c. The other electrode of the power source, for example, negative voltage is applied to the power lines 13, 15a to 15c. The I/O cells 16a and 16b are connected to the lower-layered power lines 12 and 13 with contacts. Therefore, the I/O cells 16a and 16b are supplied with power.

As described above, in the I/O cells 16a and 16b located around the semiconductor tip, the parts located above the bypass capacitors 11a and 11b are removed in the upper-layered power lines 14a to 14c, and 15a to 15c. Then these power lines are connected to the lower-layered power lines 12 and 13 with the contacts. Therefore, noise on the upper-layered power lines 14a to 14c, and 15a to 15c travels through the contacts to the lower-layered power lines 12 and 13 being connected to the bypass capacitors 11a and 11b, resulting in effectively eliminating the noise with the capacitors 11a and 11b.

In the semiconductor devices of this invention, a first power line being connected to a bypass capacitor is connected with contacts to a second power line from which a part located above the bypass capacitor is removed. Therefore, noise on the second power line travels to the first power line being connected to the bypass capacitor, resulting in effectively eliminating the noise.

The foregoing is considered as illustrative only of the principle of the present invention. Further, since numerous modifications and changes will readily occur to shoes skilled in the art, it is not desired to limit the invention to the exact construction and applications shown and described, and accordingly, all suitable medications and equivalents may be regarded as falling within the scope of the invention in the appended claims and their equivalents.

What is claimed is:

1. A semiconductor device having a multilayer wiring structure, comprising
    a bypass capacitor;
    a first power line connected to one terminal of said bypass capacitor;
    a second power line connected to another terminal of said bypass capacitor;
    a third power line from which a part corresponding to a position of said bypass capacitor is removed;
    a fourth power line from which a part corresponding to the position of said bypass capacitor is removed;
    a first contact for connecting said first power line and said third power line; and
    a second contact for connecting said second power line and said fourth power line.

2. The semiconductor device according to claim 1, wherein a plurality of said contacts is provided.

3. The semiconductor device according to claim 1, wherein said contact is attached to an end of said second power line.

4. The semiconductor device according to claim 1, wherein said contact is made wider than said first power line and said second power line.

5. The semiconductor device according to claim 1, wherein said bypass capacitor is installed close to a circuit which is supplied with power.

6. The semiconductor device according to claim 5, wherein said circuit is an I/O cell installed around a semiconductor tip.

7. The semiconductor device according to claim 1, wherein:
    said bypass capacitor is a transistor comprising:
        a gate electrode formed on a semiconductor substrate through a gate insulating film; and
        source/drain regions formed on the semiconductor substrate with said gate electrode inserted therebetween; and
    said first power line is connected to one of said source/drain regions and said gate electrode of said transistor.

8. The semiconductor device according to claim 1, wherein said second power line is installed in an upper wiring layer than said first power line.

* * * * *